(12) United States Patent
Mochizuki

(10) Patent No.: US 6,580,901 B1
(45) Date of Patent: Jun. 17, 2003

(54) BURST-TYPE TRANSMISSION OUTPUT POWER CONTROL APPARATUS CAPABLE OF REDUCING PHASE ERRORS

(75) Inventor: Takuji Mochizuki, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/466,168

(22) Filed: Dec. 17, 1999

(30) Foreign Application Priority Data

Dec. 18, 1998 (JP) ............................................. 10-360845

(51) Int. Cl.[7] ............................. H01Q 11/12; H01B 1/04
(52) U.S. Cl. ....................................... 455/127; 455/126
(58) Field of Search ................................ 455/126, 127, 455/13.4, 68, 116, 522, 63, 67.3; 330/279, 137, 97, 129, 136

(56) References Cited

U.S. PATENT DOCUMENTS

| | | | | |
|---|---|---|---|---|
| 5,101,176 A | * | 3/1992 | Norimatsu | 330/279 |
| 5,214,393 A | * | 5/1993 | Aihara | 330/129 |
| 5,369,789 A | * | 11/1994 | Kosugi et al. | 455/126 |
| 5,732,334 A | * | 3/1998 | Miyake | 330/129 |
| 5,787,336 A | * | 7/1998 | Hirschfield et al. | 330/129 |
| 5,977,833 A | * | 11/1999 | Attimont et al. | 330/297 |
| 6,194,963 B1 | * | 2/2001 | Camp, Jr. et al. | 330/149 |
| 6,377,784 B2 | * | 4/2002 | McCune | 455/108 |
| 2001/0014593 A1 | * | 8/2001 | McCune | 455/127 |

FOREIGN PATENT DOCUMENTS

| | | |
|---|---|---|
| EP | 0546693 | 6/1993 |
| GB | 2323987 | 10/1998 |
| JP | 5-152977 | 6/1993 |
| JP | 6-232655 | 8/1994 |
| JP | 9-172380 | 6/1997 |
| JP | 9-289425 | 11/1997 |
| JP | 10-23089 | 1/1998 |

* cited by examiner

Primary Examiner—Tracy Legree
(74) Attorney, Agent, or Firm—Dickstein, Shapiro, Morin & Oshinsky, LLP.

(57) ABSTRACT

An burst-type transmission output power control apparatus, includes an open loop formed by variable power driver for amplifying a modulated wave signal, a saturation type high power amplifier and a directional coupler. A closed loop is constructed by a variable attenuator, connected to the directional coupler, a detector and a relative error amplifier connected to the saturation type high power amplifier. A voltage converter supplies a power supply voltage to the saturation type high power amplifier so that a saturation output of the saturation type high power amplifier is raised for a period at least before and after a steady-state burst waveform, including rising and falling time periods.

9 Claims, 9 Drawing Sheets

BURST-TYPE TRANSMISSION OUTPUT POWER CONTROL APPARATUS CAPABLE OF REDUCING PHASE ERRORS

BACKGROUND OF THE INVENTION

1. Field of the Invention

The present invention relates to a burst-type transmission power control apparatus of a radio transmitter, more particularly, to a burst-type transmission power control apparatus suitable for use in a radio transmitter in a time division multiple access (TDMA) system.

2. Description of the Related Art

Technological developments in the field of mobile communication terminals in recent years have been remarkable, Particularly in terms of cellular telephone mobile communication systems which may typically be referred to as special mobile (GSM) systems designed for moving subscribers to utilize telephones. The transmission systems used by such mobile communication systems are shifting or have shifted from analog radio transmission systems to digital radio transmission systems in order to be compatible with networks based on digital exchange technologies, improve the sound quality, maintain the confidentiality of coded signals and raising the communication capacity.

In addition, low-and medium-altitude orbit mobile satellite communication systems have become commercially feasible in recent years as global digital mobile communication systems are connected to each other in a seamless fashion along with portable terminal technologies. As a result, the demand for such systems and such terminals is rapidly increasing.

In such mobile communication systems, the TDMA radio system is used for portable terminals for the purpose of simple communication in order to reduce the load of the hardware on the portable terminal.

Additionally, high speed automatic power control (APC) systems adapted to control the power output including a ramping waveform added thereto before and after a steady-state burst for controlling the transmission burst output level and preventing diffusion into adjacent channels of the transmission spectrum on a frequency base at the time of turning on/off the burst, has been used in order to maintain the quality of transmission/reception lines which can handle a certain level of traffic intensity and allow high density multiple access within the same communication cell.

A first prior art burst-type power control apparatus is of a closed loop type which detects a part of transmission power by a detector and feeds it back tot he gate of a high power amplifier formed by a GaAs field effect transistor (FET) or a Si bipolar transistor (see: FIG. 9 of JP-A-5-152977). This will be explained in detail later.

In the above-described first prior art burst-type transmission power control apparatus, however, since the dynamic range of the detector is narrow, it is difficult both to increase the speed of the rising and falling characteristics of a transmission burst signal, and to increase the power level of a transmission burst signal.

A second prior art burst-type transmission control apparatus further includes a variable attenuator in the closed loop of the first prior art burst-type transmission control apparatus (see: FIG. 10 of JP-A-5-152977). The attenuation degree of the variable attenuator is controlled so as to cause the maximum input level of the detector to be constant, thus broadening the dynamic range o the closed loop, so that the operation of the detector is stabilized on a reproducible basis. This also will be explained in detail later.

In the above-described second prior art burst-type transmission control apparatus, however, the control sensitivity of the high power amplifier is not improved, thus exhibiting a high damping coefficient and giving rise to an overshoot or undershoot during the rising burst period.

A third prior art burst-type transmission control apparatus further includes a variable power driver amplifier at a prestige of the high power amplifier of the second prior art burst-type transmission control apparatus, so as to suppress fluctuation of the control sensitivity of the high power amplifier depending on the output power level (see: FIG. 1 of JP-A-5-152977 & JP-A-10-172380). This also will be explained in detail later.

In the above-described third prior art burst-type transmission control apparatus, however, phase fluctuations occur in the high power amplifier because abrupt fluctuations in the amplitude envelope which occur inside the high power amplifier at and near the burst rising and falling time periods intersects the above phase fluctuation region.

Figure 1:
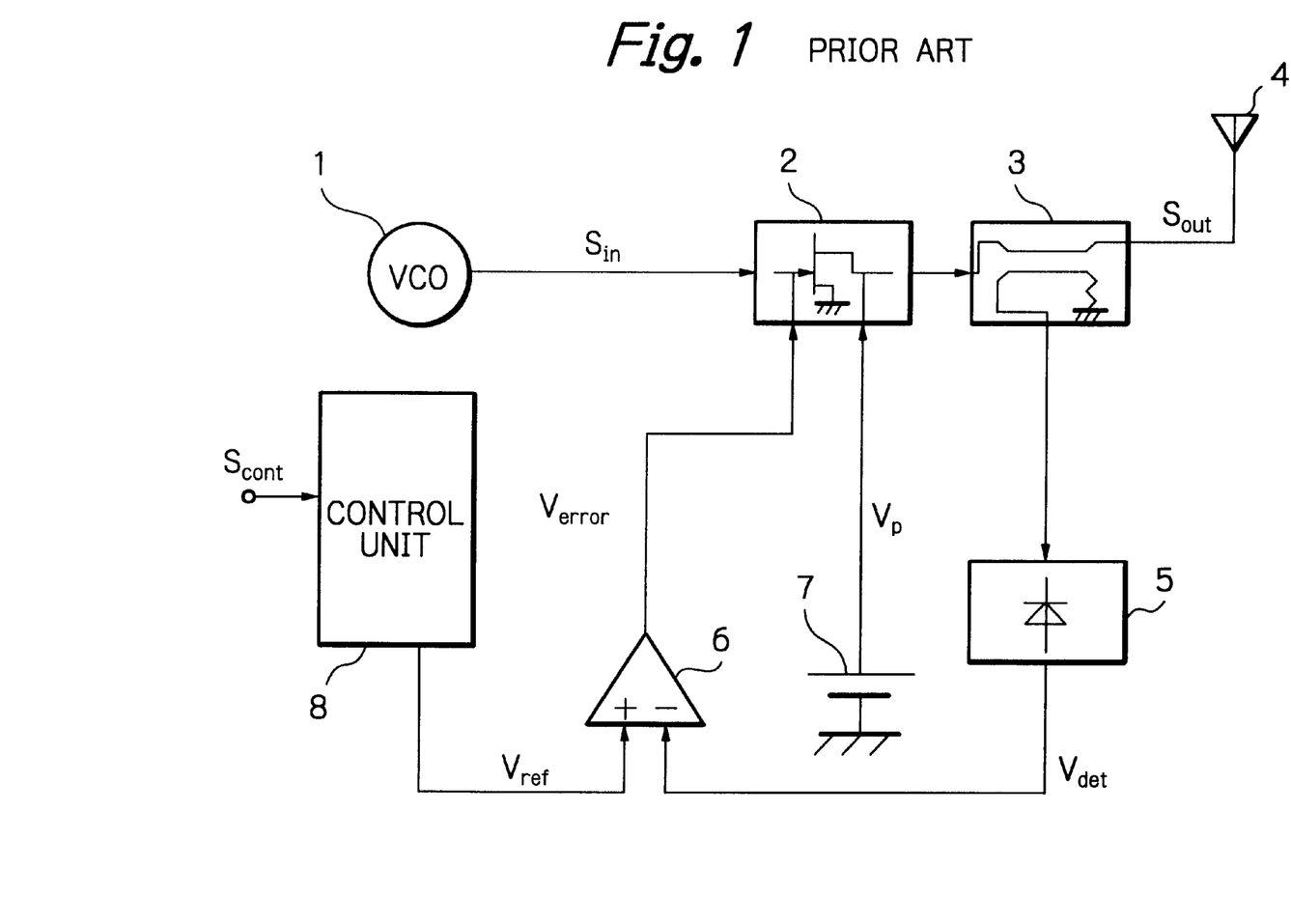
FIG. 1 is a circuit diagram illustrating a first prior art burst-type transmission output control apparatus.

In FIG. 1, which illustrates a first prior art burst-type transmission control apparatus (see: FIG. 9 of JP-A-5-152977), a modulated signal $S_{in}$ generated from a modulated wave generator 1 which is, in this case, a voltage controlled oscillator (VCO) is transmitted to a high power amplifier 2. As a result, the high power amplifier 2 is driven by the modulated signal $S_{in}$ to generate a transmission burst signal $S_{out}$ via a directional coupler 3. The transmission burst signal $S_{out}$ is radiated from an antenna 4.

The directional coupler 3 takes out a part of the transmission burst signal $S_{out}$, and a detector 5 formed by a diode detects the output signal of the directional coupler 3. A relative error amplifier 6 compares a reference voltage $V_{ref}$ as shown in FIG. 2A with the detection voltage $V_{det}$ Of the detector 5 as shown in FIG. 2B to generate an error voltage $V_{error}$ in accordance with the difference between the reference voltage $V_{ref}$ and the detection voltage $V_{det}$.

The high power amplifier 2 is constructed by a GaAs field effect transistor (FET) having a gate for receiving the error voltage $V_{error}$, a grounded source and a drain for receiving a power supply voltage $V_p$ from a power supply battery 7.

Figure 2A:
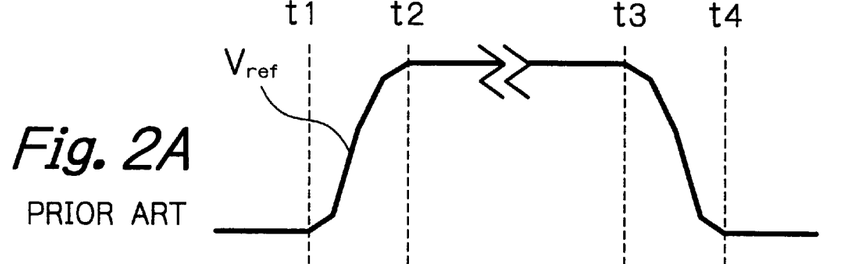
FIGS. 2A, 2B and 2C, are timing diagrams for explaining the operation of the apparatus of FIG. 1.
Figure 2B:
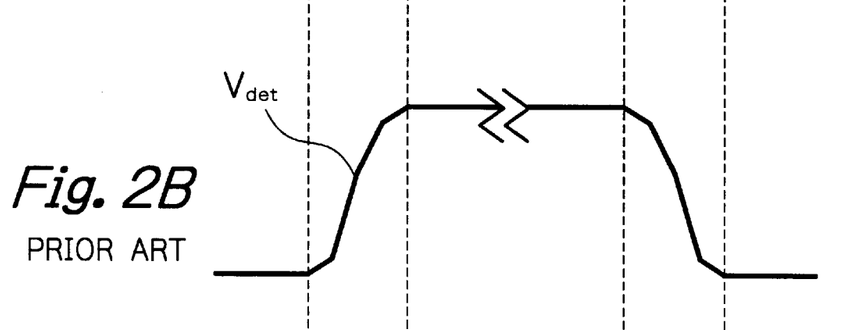
Figure 2C:
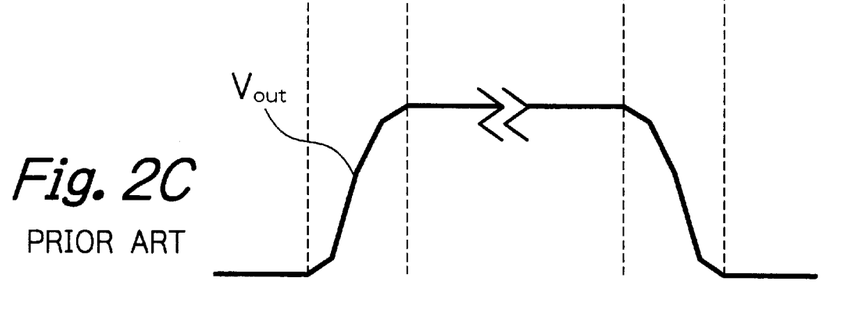

Thus, the transmission burst signal $S_{out}$ is fed back by a closed loop of the detector 5 and the relative error amplifier 6 to the high power amplifier 2, so that the transmission burst signal $S_{out}$ as shown in FIG. 2C is brought close to the reference voltage $V_{ref}$ as shown in FIG. 2A. In other words, when $V_{ref}$ where the level of the transmission burst signal $S_{out}$ is higher than a desired level, the relative error amplifier 6 decreases the error voltage $V_{error}$, thus decreasing the level of the transmission burst signal $S_{out}$. On the other hand, when $V_{det} < V_{ref}$ where the level of the transmission burst signal $S_{out}$ is lower than the desired level, the relative error amplifier 6 increases the error voltage $V_{error}$) thus increasing the level of the transmission burst signal $S_{out}$.

The reference voltage $V_{ref}$ is generated from a control unit 8 which receives a control signal $S_{cont}$ from a base station or the like. The control unit 8 convolutes a rectangular envelope waveform at a steady-state time period defined by time t2 and time U, a rising ramping envelope wave form at a rising time period defined by time t1 and time t2, and a falling ramping envelope waveform at a falling time period defined by time U and time t4 on a time basis. The rising and falling ramping envelope waveforms are helpful in removing the spurious spectrum of the transmission burst signal $S_{out}$ due to the switching of the GaAs FET of the high power amplifier 2.

Note that waveforms of the reference voltage $V_{ref}$ depending on the control signal $S_{cont}$ are stored in a read-only memory (ROM) or a random-access memory (RAM) of the control unit 8 in advance.

In the case of fixed envelope modulation such as Gaussion filtered minimum shift keying (GMSK) modulation which is a angular modulation intrinsically free from amplitude fluctuations unlike π/4 shift quadrature phase shift keying (QPSK) modulation for personal digital cellular (PDC), there is no need for relative error control to select a relatively large time constant for the loop amplifier including the relative error amplifier 6 for smoothing the detection voltage $V_{det}$ including the amplitude fluctuations after detecting the envelope of the transmission burst signal $S_{out}$, taking the averaged power into consideration. In other words, it is possible to select a relatively small time constant in advance and specify only design parameters for the purpose of performing feedback control, of the saturation power level and hence high speed operation of the automatic power control (APC) loop.

In the burst-type transmission power control apparatus of FIG. 1, however, since the dynamic range of the detector 5 is narrow, it is difficult both to increase the speed of the rising and falling characteristics of the transmission burst signal SO, and it is difficult to increase the power level of the transmission burst signal $S_{out}$.

Also, when a low transmission power level is selected for the high power amplifier 2, the detection sensitivity fluctuates depending on its temperature.

Further, when a low transmission power level is selected for the high power amplifier 2, the output gate control sensitivity of the high power amplifier 2 becomes high and fluctuates, with the result that low-power APC control cannot be carried out stably on a reproducible basis.

Figure 3:
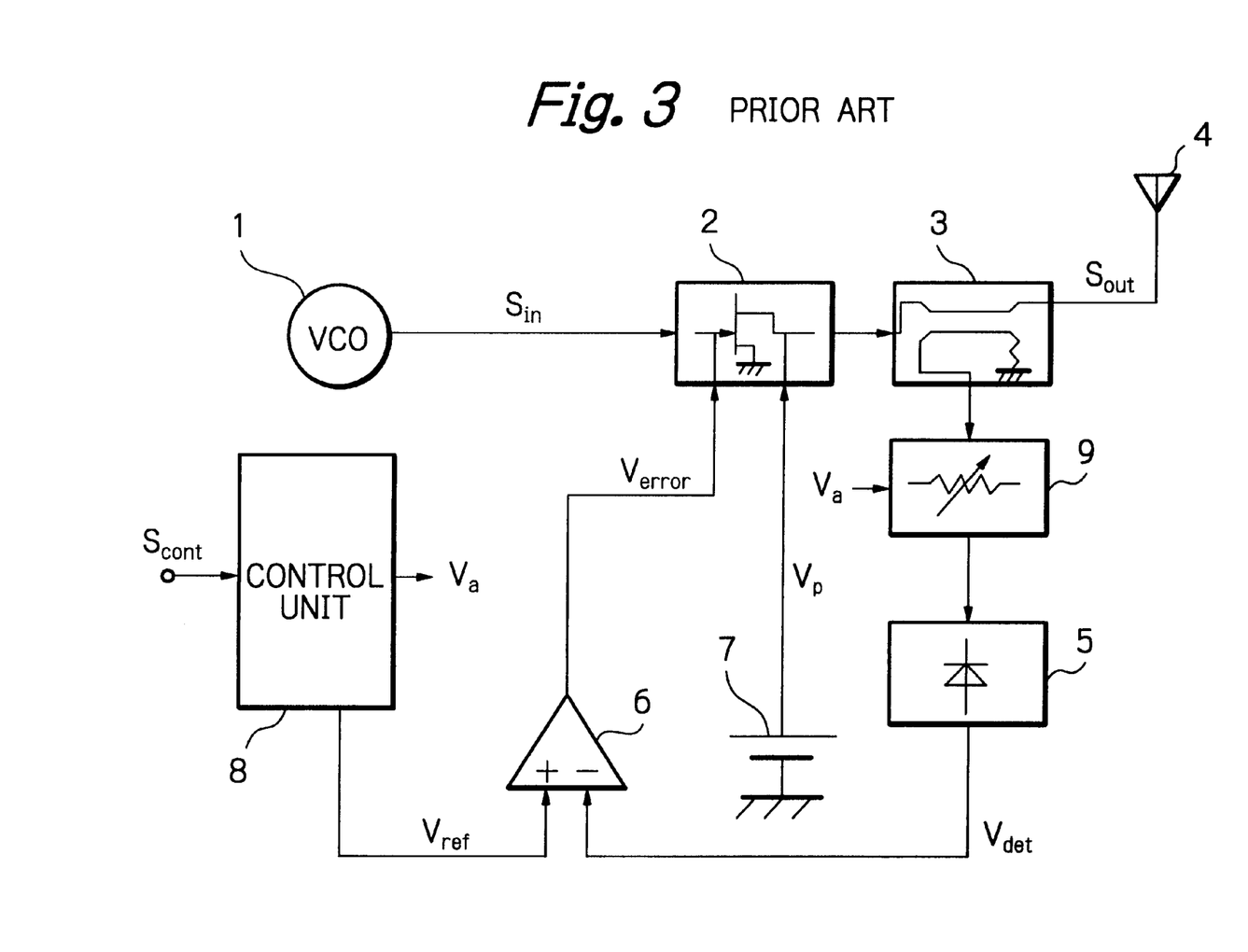
FIG. 3 is a circuit diagram illustrating a second prior art burst-type transmission output control apparatus.

In FIG. 3, which illustrates a second prior art burst-type transmission control apparatus (see: FIG. 10 of JP-A-5-152977), a variable attenuator 9 is inserted between the directional coupler 3 and the detector 5 of FIG. 1. The variable attenuator 9 is controlled by a control voltage $V_a$ from the control unit 8, so as to make the maximum input level of the detector 5 constant. Therefore, if the control sensitivity of the detector 5 is held to a substantially constant level by arranging the variable attenuator 9 upstream relative to the detector 5, it is then possible to provide accurate transmission power control over a wide dynamic range from a low power output to a high power output simply by means of a closed loop formed by the high power amplifier 2, the directional coupler 3, the variable attenuator 9, the detector 5 and the relative error amplifier 6. Thus, the dynamic range of the closed loop is broadened so that the operation of the detector 5 is stabilized on a reproducible basis.

In the burst-type transmission control apparatus of FIG. 3, however, since the control sensitivity of the high power amplifier 2 is not improved, in particular, since the control sensitivity of the high power amplifier 2 is high when a low transmission power level is selected for the high power amplifier 2, a higher open loop gain and a broader loop band are obtained, thus exhibiting a high damping coefficient and giving rise to an overshoot or undershoot during the rising burst period.

In more detail, generally, as for the relationship between the error voltage $V_{error}$ and the transmission burst signal $S_{out}$ or the output voltage of the high power amplifier 2, the control sensitivity defined by the power increment per the error voltage increment of the high power amplifier 2 is in the form of a curve which is high when the latter is producing allow power output and falls to a saturation level at a point near the maximum power output.

Thus, the control sensitivity of the high power amplifier 2 changes to a large extent, depending on the transmission power level.

In particular, the control sensitivity-rises to make rapidly, causing closed loop to oscillate spuriously in the manner described above when the output power level is low.

Note that the above-mentioned oscillation of the closed loop, which occurs when a low output power level is selected can be eliminated by appropriately selecting certain other constants to narrow the loop band and adopting a large time base for the closed loop, in order to delay its response. However, using this technique for correcting the control sensitivity, the response of the closed loop is constantly delayed. In particular, since the control sensitivity of the high power amplifier 2 falls when the maximum power output is selected, the response of the closed loop is greatly delayed at that time to make it impossible to control the burst output including the ramping waveforms before and after the steady-state burst in a desired manner. As a result, it is no longer possible to expect the effect of APC on various environmental changes including fluctuations in the supply voltage, the input level and/or the power gain of the high power amplifier 2.

Thus, in the burst-type transmission control apparatus of FIG. 3, if there is a resistance/inductance/capacitance (RLC) constant in the closed loop, which can cause the phase to undergo an extreme turn within the loop band, no safe margin can be secured for the phase nor for the amplitude, and a spurious oscillation may occur because of the positive feedback generated at and near the frequency where a higher-order curve of the open loop transfer characteristics intersects the 0 gain.

Figure 5:
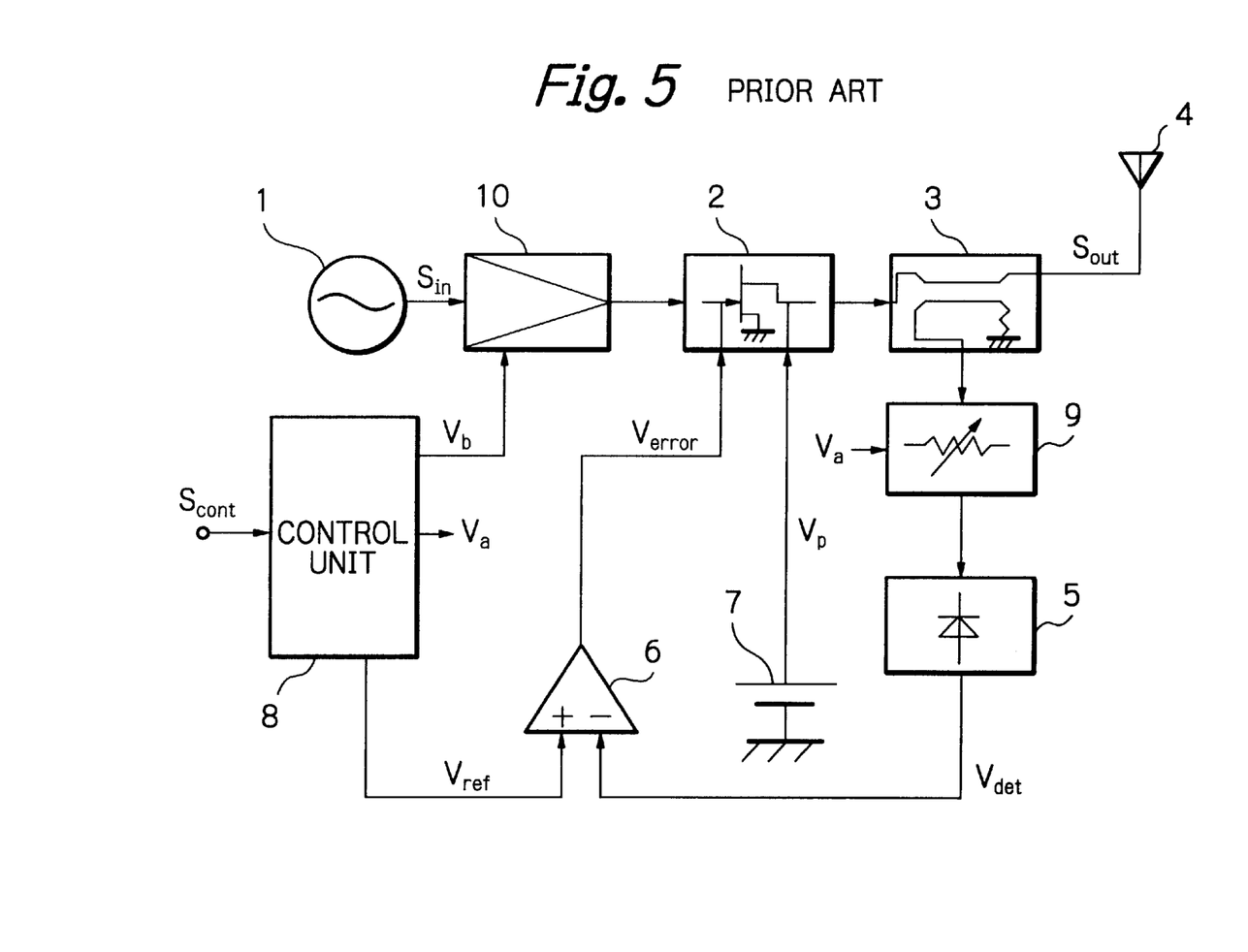
FIG. 5 is a circuit diagram illustrating a third prior art burst-type transmission output control apparatus.

In FIG. 5, which illustrates a third prior art burst-type transmission output control apparatus (see: FIG. 1 of JP-A-5-152977 & JP-A-10-172380), a variable power driver amplifier 10 capable of regulating its gain is connected between the modulated wave generator I and the high power amplifier 2 so as to suppress fluctuation of the control sensitivity of the high power amplifier 2, depending on the output power level.

In FIG. 5, in addition to the feedback control for controlling the output of the high power amplifier 2 by means of the error voltage V error from the relative error amplifier 6, feed forward control of controlling the output level of the variable power driver amplifier 10 is carried out in such a way that the high power amplifier 2 may show a substantially constant control sensitivity level relative to the desired transmission power level. In other words, in addition to the closed loop feedback control adapted to maintain the detection sensitivity of the closed loop constant relative to fluctuations in the transmission power output, open control, i.e., feed forward control, is provided on the output level of the variable power driver amplifier 10 in response to the transmission power level so as to cause the control sensitivity of the high voltage power amplifier 2 to be at a constant level. Therefore, it is now possible to control the power output stably and accurately during the steady-state burst time period, including the rising and falling ramping time periods, over a wide dynamic power output range.

Figure 4:
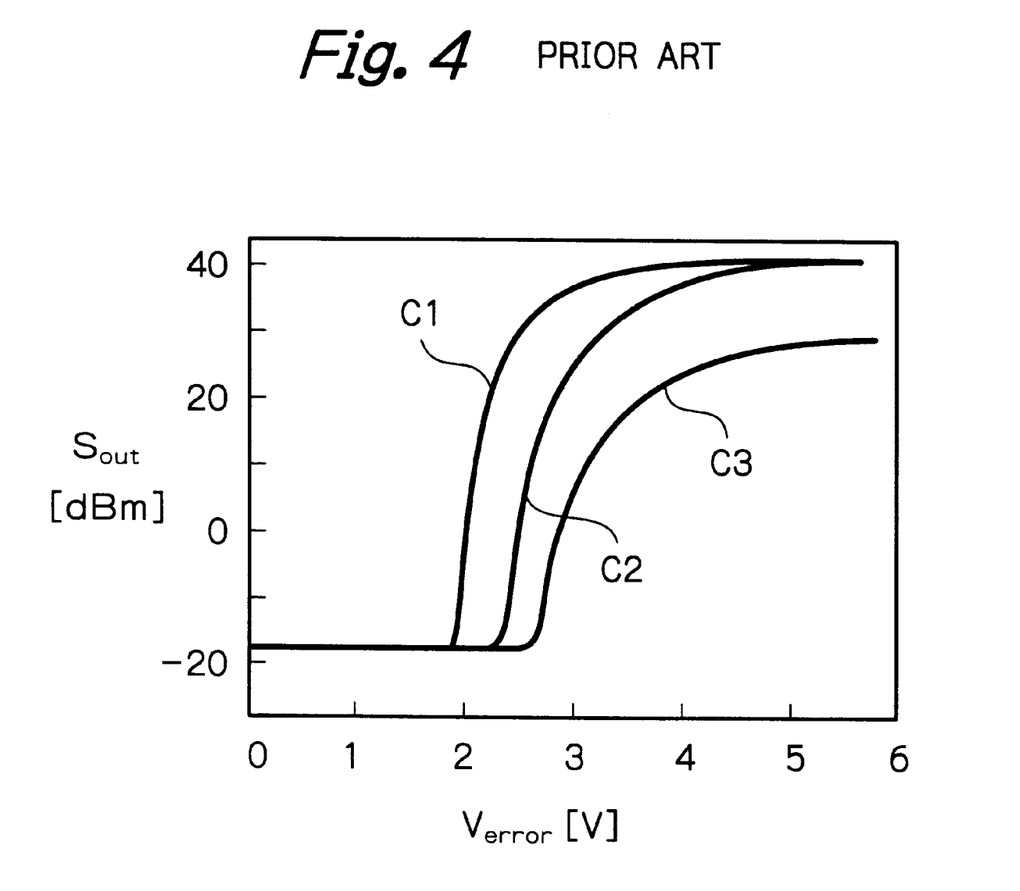
FIG. 4 is a graph showing the relationship between the error voltage and the transmission burst signal of FIG. 3.

For example, when the power output should be stabilized by means of APC feedback by reducing the transmission burst signal, $S_{out}$ from the high power amplifier 2 by 10 dB from the selected maximum output level, the input level of the high power amplifier 2 is reduced by 12 dB to cause the control sensitivity to shift from the curve C1 to the curve C2 in FIG. 4. As a result, the feedback operation can be carried out without modifying the error voltage $V_{error}$ and the control sensitivity obtained when the maximum power output is selected, so that the effect of APC remains stable and accurate regardless of whether a low power output or the maximum power output is selected.

Similarly, when the power output should be stabilized by means of APC feedback by reducing the transmission burst signal $S_{out}$ from the high output power amplifier 2 by 24 dB from the selected maximum output level, the input level of the high power amplifier 2 is reduced by 30 dB to cause the control sensitivity to shift from the curve C1 to the curve C3 in FIG. 4.

Thus, the feedback operation can be carried out without modifying the control sensitivity, with the result that the effect of APC remains stable and accurate regardless of whether a low power output or the maximum power output is selected.

The optimum control voltage $V_6$ is selected in advance for each output power level of the high power amplifier 2 and stored in the ROM or RAM in the control unit 8, so that it can be retrieved from the ROM or RAM by means of an output power setting command when the corresponding output power level is selected in order to ensure a substantially optimum drive input. The subsequent operation of controlling the output stably and accurately is carried out by means of the closed loop feedback system.

However, when the transmission power control apparatus of FIG. 5 is applied to a terrestrial mobile communication terminal for global system for mobile communication (GSM), personal communications network (PCN) or personal communications system (PCS) using a GMSK modulation or a medium altitude orbit mobile satellite communication terminal utilizing a Gaussian filtered minimum shift keying (GMSK) modulation system, there remains a problem of phase error of the transmission burst due to phase fluctuations of the phase of the high power amplifier 2, which can occur in the burst-rising and-falling time periods.

Terrestrial mobile communication terminals and medium-altitude orbiting mobile satellite communication terminals employ a fixed envelope modulation system which ensures a high efficiency operation in the saturation region of the high power amplifier 2 when a high output power level is selected. Therefore, the steady-state operation point of the high power amplifier 2 is normally set in the saturation region. Under this condition, generally, a phase modulation (PM) region exists at and near the output saturation point of the high power amplifier 2.

As described above, phase fluctuations occur in the high power amplifier 2 because abrupt fluctuations in the amplitude envelope which occur inside the high output control amplifier 2 at and near the burst rising and falling time periods intersects the above phase fluctuation region.

SUMMARY OF THE INVENTION

It is an object of the present invention to provide a burst-type transmission control apparatus capable of reducing phase fluctuations, i.e., phase errors.

According to the present invention, a burst-type transmission output control apparatus, includes an open loop formed by a variable power driver for amplifying a modulated wave signal, a saturation type high power amplifier, and a directional coupler. A closed loop is constructed by a variable attenuator connected to the directional coupler, a detector and a relative error amplifier connected to the, saturation type power amplifier. A voltage converter supplies a power supply voltage to the saturation type high power amplifier so that a saturation of the saturation type high power amplifier is raised only for a short period before and after a steady-state burst waveform, including rising and falling time periods.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Figure 6:
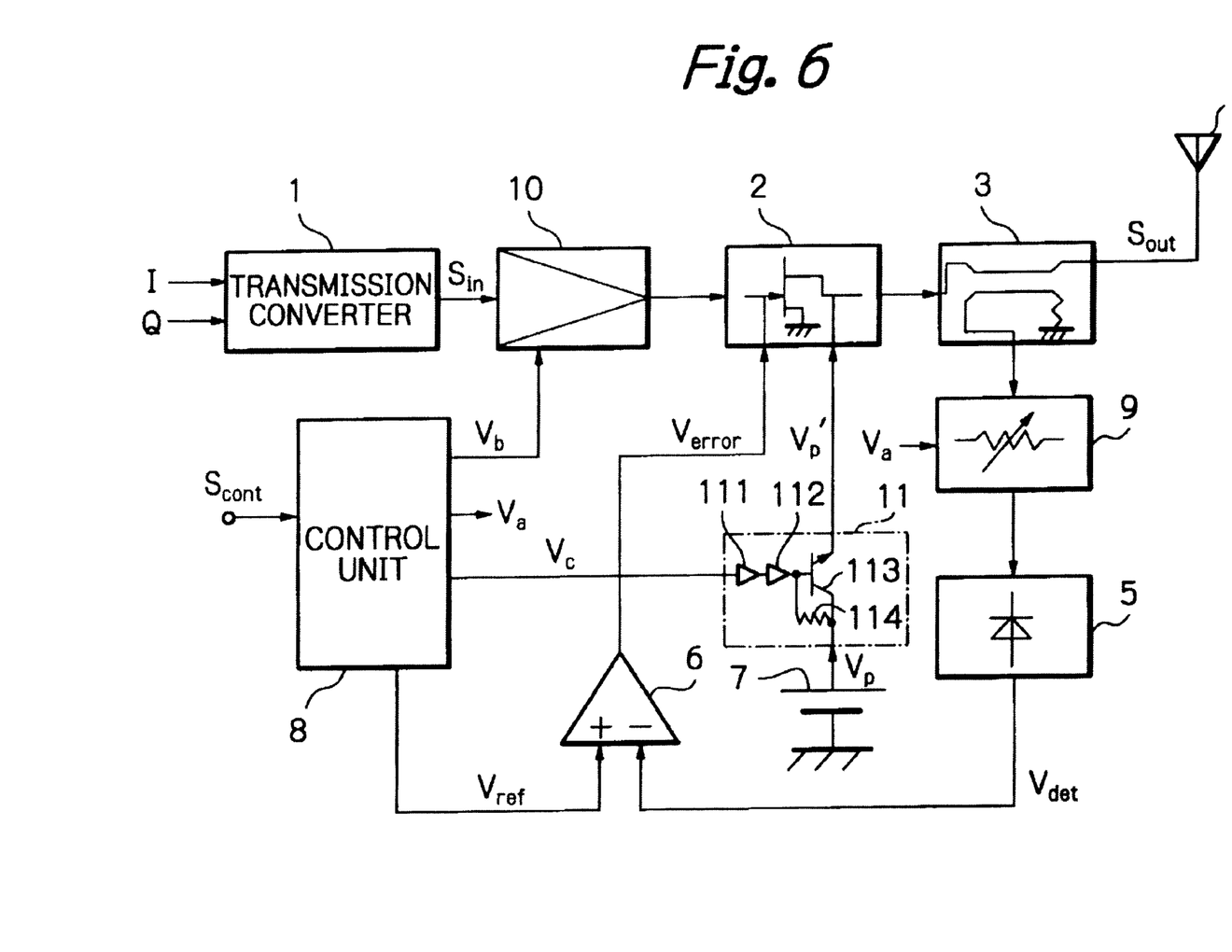
FIG. 6 is a circuit diagram illustrating a first embodiment of the burst-type transmission output control apparatus according to the present invention.

In FIG. 6, which illustrates a first embodiment of the burst-type transmission control apparatus according to the present invention, a transmission converter 1' is provided instead of the modulated wave generator 1 of FIG. 5. The transmission converter 1' includes a modulator and a local oscillator to modulate two digital baseband signals I and Q or an input base signal by means of GMSK modulation and outputs a modulated signal $S_{in}$.

Also, a voltage converter 11 formed by a DC/DC converter or a series dropper is connected between the power supply-battery 7 and the high power amplifier 2 of FIG. 6. The voltage converter 11 normally supplies a stabilized supply voltage $V_p'$ to the drain voltage terminal of the high power amplifier 2 and operates to raise the supply voltage $V_p'$ only for a short period of time before and after the steady-state burst time period including the burst-rising and-falling ramping time periods under the control of the control unit 8.

The voltage converter 11 is constructed by an, in-phase voltage amplifier 111 for amplifying a control voltage $V_c$, a voltage follower 112 having an operational amplifier for receiving the output voltage of the in-phase voltage amplifier 111, a large power NPN-type transistor 113 having a base connected to the output of the voltage follower 113, a collector connected to the power supply battery 7 and an emitter connected drain voltage terminal of the high power amplifier 2, and a resistor 114 connected between the base and the collector of the transistor 113.

The control of voltage $V_c$ from the control unit 8 is amplified by the in-phase voltage amplifier 111 and is supplied to the base of the transistor 113 by way of the voltage follower 112. At this time, the in-phase voltage amplifier 111 operates so as to make the voltage level of the amplified voltage lower than the voltage $V_p$ of the power supply battery 7.

Thus, the voltage $V_p'$ which is lower than the voltage $V_p$ of the power supply battery 7 and has dropped from the base voltage of the transistor 113 by the voltage between the emitter and base (about 0.6 to 0.7V) thereof is applied to the drain voltage terminal of the high power amplifier 2.

The control unit 8 generates the voltage $V_a$ for the variable attenuator 9, the control voltage $V_b$ for the variable power driver amplifier 10, the control voltage $V_c$ for the voltage converter 11 and the reference voltage $V_{ref}$ for the relative error amplifier 6, in accordance with the control signal $S_{out}$ including a burst timing command and an output-power setting command from the base station. The burst timing command designates the timing of the next transmission burst, and the output power setting command designates the output level of the transmission burst signal $S_{out}$. Also, in the same way as in the apparatus of FIG. 5, the degree of attenuation to be achieved by the variable attenuator 9 is controlled so as to cause the input to the detector 5 to be at a constant level without depending on the transmission burst signal $S_{out}$. As a result, a broad dynamic range can be realized for the detection system and the detection sensitivity of the detection system can be held to a constant level regardless of the transmission power. Further, in the same way as in FIG. 5, the output level of the variable power driver amplifier 10 is controlled to optimize the input level of the high power amplifier 2 in order to hold the control sensitivity of the high power amplifier 2 relative to the transmission output power level.

The operation of the burst-type transmission control apparatus of FIG. 6 is explained next with reference to FIGS. 7A, 7B, 7C, 7D and 7E.

Figure 7A:
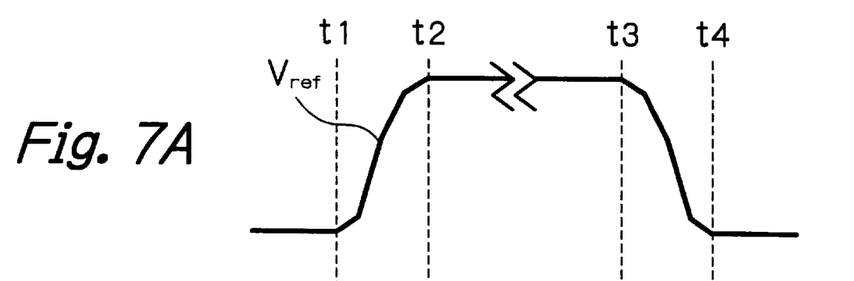
FIGS. 7A through 7E are timing diagrams for explaining the operation of the apparatus of FIG. 6.
Figure 7B:
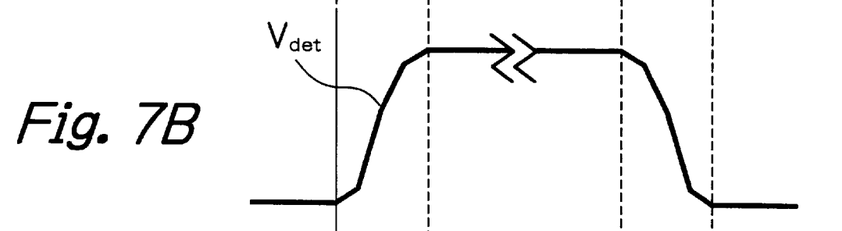
Figure 7C:
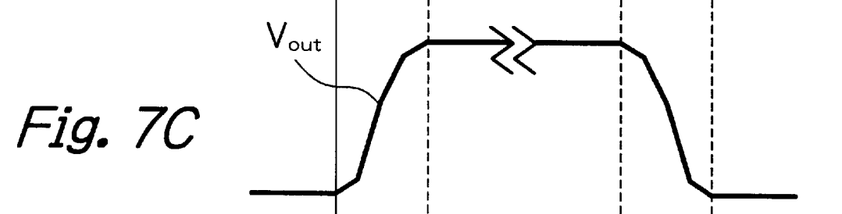

The relative error amplifier 6 compares the reference voltage $V_{ref}$ as shown in FIG. 7A with the detected voltage $V_{det}$ as shown in FIG. 7B, to generate the error voltage $V_{error}$ and transmit it to the gate terminal of the high power amplifier 2. Thus, the transmission burst signal $S_{out}$ is controlled by the feedback of the error voltage $V_{error}$, so that the detected voltage $V_{det}$ is brought close to the reference voltage $V_{ref}$. As a result, as shown in FIG. 7C, the waveform of the transmission burst signal $S_{out}$ is brought close to that of the reference voltage $V_{ref}$.

A considerably large value can be selected for the closed loop band of the loop provided that fixed envelope modulation such as GMSK is in place as in the embodiment. The loop is designed so that the loop response (loop time constant) is faster than the burst time and slower than the symbol rate, and the loop constant is selected so as to make the circuit follow a high speed burst including ramping stably at high speed.

In more detail, the reference voltage $V_{ref}$ has a waveform obtained by convoluting the ramping output envelope waveform at the rising and falling time periods of the burst and the rectangular output envelope waveform at the steady-state burst period on a time base. The ROM or RAM in the control unit 8 stores a lookup table showing the correspondence between the reference voltage $V_{ref}$ and the transmission power level shown in FIG. 7A.

During the steady-state burst period, the reference voltage $V_{ref}$ is held to a level which corresponds to the level of the detected voltage $V_{det}$ in the steady-state period for each transmission power level, provided that the detected voltage $V_{det}$ is ideal and therefore the transmission burst signal $S_{out}$ is at a level which corresponds to the transmission power level specified by the transmission power level setting command in the steady-state burst period Then, the control unit 8 retrieves the reference voltage $V_{ref}$ corresponding to the transmission power level specified by the transmission power setting command from the lookup table and outputs it to the relative error amplifier 6 at the timing specified by the burst timing.

The relative error amplifier 6 operates to decrease the error voltage $V_{error}$ to be applied to the high power amplifier 2 when the detected voltage $V_{det}$ is higher than the reference voltage $V_{ref}$ and hence the transmission burst signal $S_{out}$ is higher than the desired level in order to decrease the transmission output power level of the high power amplifier 3. On the other hand, the relative error amplifier 6 operates to increase the error voltage $V_{ref}$ to be applied to the high output power amplifier 2 when the detected voltage $V_{det}$ is lower than the reference voltage $V_{ref}$ and hence the transmission burst signal $S_{out}$ is lower than the desired level in order to increase the transmission output power level of the high power amplifier 2.

The gate voltage terminal of the high power amplifier 2 is connected to the gate of the transistor typically located at the last stage inside the high power amplifier 2. Therefore, the output level of the high power amplifier 2 changes in accordance with the error voltage $V_{error}$.

Thus, the transmission burst signal $S_{out}$ is automatically controlled to become equal to the desired transmission output level including the ramping waveforms before and after the steady-state burst as shown in FIG. 7A, in response to the error voltage $V_{error}$.

Thus, in the same way as in the apparatus of FIG. 5, since the dynamic range of the detection system is broadened by controlling the variable attenuator 9 as described above, the apparatus operates stably on a reproducible basis regardless of the transmission output power level.

In addition to the above-described feedback control for controlling the output of the high power amplifier 2 by means of the error voltage $V_{error}$ from the relative error amplifier 6, the control unit 8 generates the control voltage $V_b$ to provide feed-forward control for controlling the output level of the variable power driver amplifier 10 in such a way that the high power amplifier 2 has a substantially constant control sensitivity level relative to the desired transmission power level.

Thus, in the same way as in the apparatus of FIG. 5, with the arrangement for controlling the detection sensitivity of the detection system and the control sensitivity of the high power amplifier 2 by way of the open loop depending on each selected transmission output power level, using the control voltage $V_a$ and $V_b$ supplied from the control unit 8, within the closed loop feedback control system including the detection system and the high power amplifier 2, it is now possible to control the power output stably and accurately during the steady-state burst including the rising and falling time periods of the transmission burst, over a wide dynamic range of power output.

Under the above-mentioned condition, generally, a phase modulation (PM) fluctuation region exists at and near the output saturation point of the high power amplifier 2. In order to avoid the PM fluctuation region while exploiting the high-accuracy APC, the voltage converter 11 is provided.

Figure 7D:
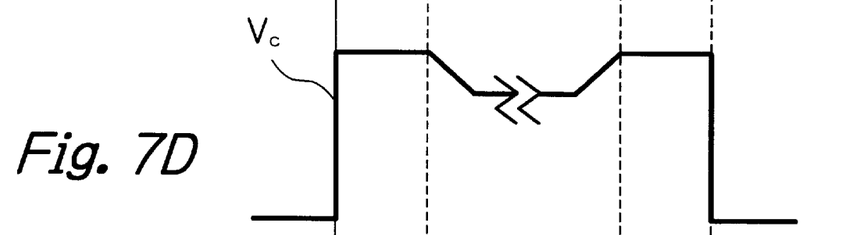
Figure 7E:
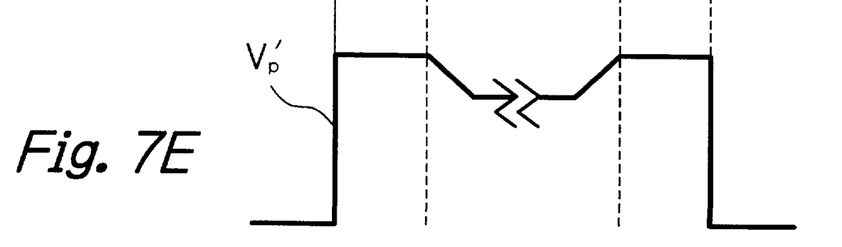

As shown in FIG. 7D, the control voltage $V_c$ has two potential levels including a constant potential level which corresponds to the power supply voltage $V_p'$ in the steady-state burst period from time t2 to time t3 and a high potential level for increasing the power supply voltage $V_p'$ or a short period of time before and after the steady-state burst period including the rising and falling ramping time periods from time t1 to time t2 and from time U to time t4.

The control voltage $V_c$ is amplified by the in-phase voltage amplifier 111 of the voltage converter 11 and is applied to the base of transistor 113 after passing through the voltage follower 112. At this time, the in-phase voltage amplifier 111 operates so as to cause the voltage level of the amplified voltage to be lower than the output voltage level d, $V_p$ of the power supply battery 7.

Thus, the voltage $V_p$ which is lower than the output voltage $V_p$ of the power supply battery 7 and has dropped from the base voltage of the transistor 113 by the voltage between the emitter and the base of the transistor 113 is applied to the drain voltage terminal of the high power amplifier 2.

As the voltage converter 11 is controlled by the control unit 8 so as to increase the power supply voltage $V_p$ for a short period of time before and after the steady-state burst period including the rising and falling ramping time periods, the saturation power output of the high power amplifier 2 is raised only for that short period.

Thus, the operating point of the high power amplifier 2 in the course of movement of the transmission burst signal $S_{out}$ from the rising ramping time period to the steady-state burst period or from the steady-state burst period to the falling ramping time period is temporarily set not in the saturation region but in the linear region where the output back-off is ensured. Therefore, the saturation point of the high power amplifier 2 can be controlled in such a way that abrupt fluctuations in the amplitude envelope which occur inside the high power amplifier 2 at and near the burst-rising and-falling time periods do not intersect the phase fluctuation region. As a result, any possible degradation of signal reception due to phase fluctuations (phase error) of the high power amplifier 2 can be suppressed and the average phase error (or the maximum phase error) of the transmission burst can be confined within an allowable range.

Since a phase error on the part of the transmission burst degrade the signal reception at the other end of the communication line, the present invention can successfully remedies such degradation.

Note that the control voltage $V_c$ is set to a lower limit in order to ensure a desired transmission output power level in the steady-state burst period after the rising ramping time period so as to cause the operating point of the high power amplifier 2 to move from the linear region to the saturation region. As a result, the high power amplifier 2 can operate reliably and highly efficiently in the steady-state burst period which constitutes almost all of the transmission burst signal $S_{out}$ so that a mobile terminal incorporating the transmission power control apparatus of FIG. 6 can effectively prevent any unnecessary rise in the average power consumption.

Additionally, the change in the power supply voltage $V_p'$ in the course of movement from the rising ramping time period to the steady-state burst period or from the steady-state burst period to the falling ramping time period is controlled by the control unit 8 in such a way that the transmission burst envelope is stably controlled by feedback control to draw a continuous and moderate envelope locus, so that the transmission burst envelope does not give rise to any inflection point as a result of a change in the power supply voltage $V_p'$.

As shown in FIG. 7D, such control can be realized by causing the reference voltage $V_{ref}$ to become inclined in the course of movement from the rising ramping time period to the steady-state burst period or from the steady-state burst period to the falling ramping time period.

Note that if the power output of the high power amplifier 2 fluctuates due to a change in the supply voltage $V_p'$ such fluctuations in the power output are sufficiently compressed by high-speed APC feedback control and do not give rise to any problem.

As described above, in the first embodiment, it is a prerequisite in a radio transmitter including the high power amplifier 2 particularly adapted to amplify and burst-transmit a modulated wave (such as GMSK) which does not involve any amplitude fluctuations with the TDMA radio communication system that highly stable, accurate and high speed APC be used to maintain the level of the output containing effective bit data for the transmission burst wave in the steady-state burst period to a constant level over a selected wide output range and that the driver amplifier 10 and the detector 5 be controlled by feed-forward control in response to the transmission output level in order to maintain the detection sensitivity of the detector 5 and the control sensitivity of the amplifier 2 at a constant level over a wide dynamic range as the loop constant existing in the feedback loop.

Also, in the first embodiment, it is a prerequisite that the output envelope ramping be controlled smoothly on the basis of the high speed ramping waveforms that are observed in the rising and falling time periods so as to meet the requirement of producing a wide range for the transmission output power level and preventing diffusion of the transient frequency spectrum at the transient response time, while satisfying the time-to-transient response mask.

Further, in order not to prevent the transmission burst from producing any phase error, the voltage converter 11 is provided so that the supply voltage $V_p'$ of the high power amplifier 2 rises only in a short period of time before and after the steady-state burst period including the rising and falling ramping time periods. Thus, the saturation point of the high power amplifier 2 can be controlled in such a way that abrupt fluctuations in the amplitude envelope which occur inside the high power amplifier 2 at and near the burst-rising and-falling time periods do not intersect the phase fluctuation region.

The phase error of the transmission burst, which is produced as a result of phase fluctuations of the high power amplifier 2, is a problem unresolved by the prior art, and thus the present invention proposes a novel-technique for controlling the supply voltage $V_p'$ of the high power amplifier 2 in order to solve the problem.

Accordingly, in first embodiment, the degradation in the efficiency of the high power amplifier 2 due to the means for preventing phase fluctuations is limited to the short period of time before and after the steady-state burst period including the rising and falling ramping time periods so that the above problem is overcome without increasing the average power consumption of the entire mobile terminal.

Figure 8:
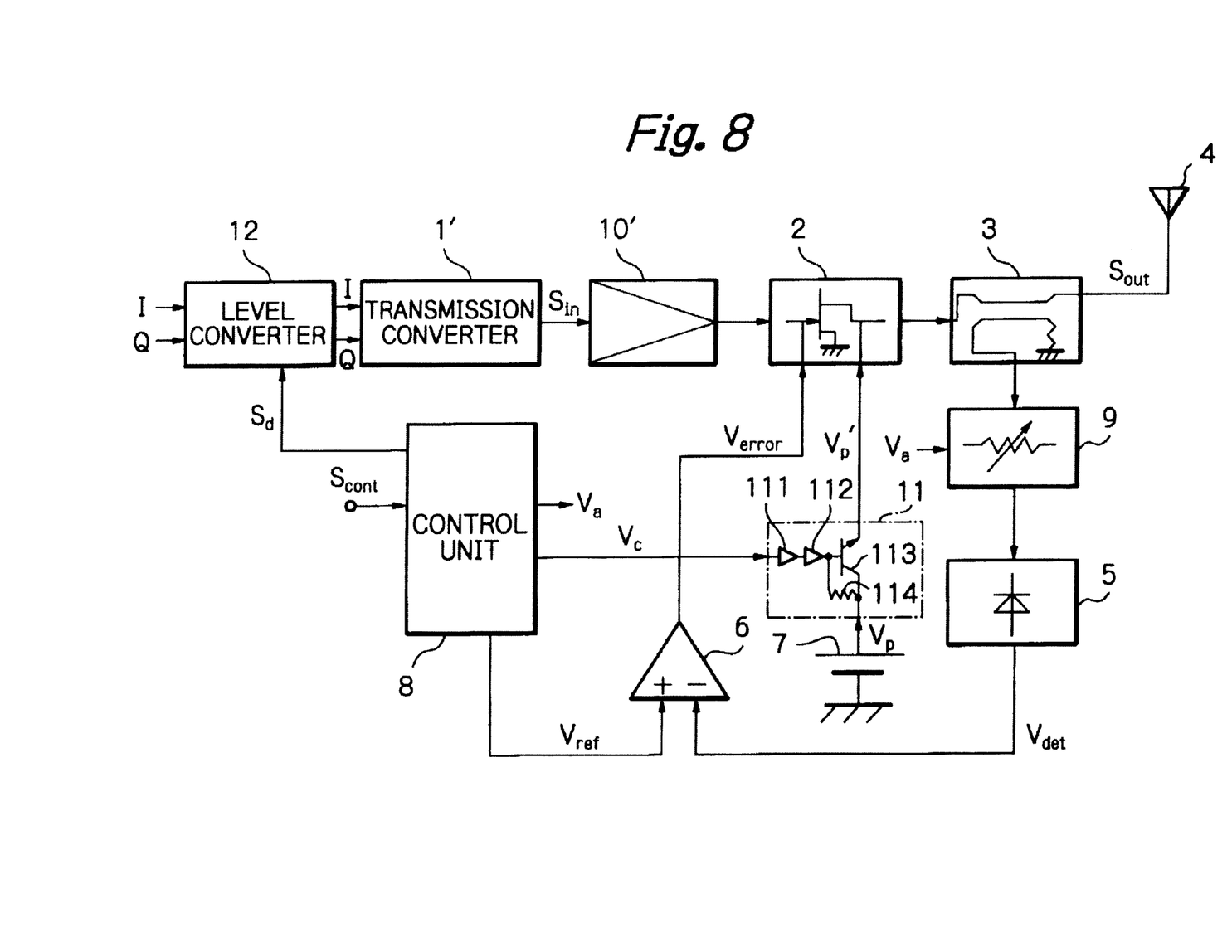
FIG. 8 is a circuit diagram illustrating a second embodiment of the burst-type transmission output control apparatus according to the present invention.

In FIG. 8, which illustrates a second embodiment of the burst-type transmission control apparatus according to the present invention, while the optimum input level of the high power amplifier 2 is selected by means of the gain control of the variable power driver amplifier 10 in an analog fashion in FIG. 6, it is selected by means of a digital baseband level converter 12 in a digital fashion in FIG. 8. Also, a fixed gain driver amplifier 10' is provided instead of the variable power driver amplifier 10 of FIG. 6.

More specifically, the digital baseband level converter 12 variably controls the level by changing the numerical values of the two digital modulated waves I and Q of the baseband in accordance with a digital level conversion signal $S_d$ from the control unit 8. The ROM or RAM in the control unit 8 stores a lookup table showing the correspondence between the digital baseband signal I and Q adapted to realize the optimum input level of the high power amplifier 2 and the selected transmission output power level.

The control unit 8 outputs the digital level conversion signal $S_d$ to the digital baseband level converter 12 in such a way that the optimum input level corresponding to the transmission output power level specified by the transmission power setting command may be obtained for the high power amplifier 2.

The operation of the control unit 8 of FIG. 8 is the same as the control unit 8 of FIG. 6, except that it generates the digital level conversion signal $S_d$ and does not generate any control voltage $V_b$.

The burst-type transmission power control apparatus of FIG. 8 including the digital baseband lever converter 12 and the transmission converter 1' can be integrated in a simple manner to control the mobile terminal in a reproducible fashion at low cost by carrying out the operation of optimizing the input level of the high power amplifier 2 not by using a high frequency analog technique but by using a digital technique.

In FIGS. 6 and 8, the voltage converter 11 is formed by a series dropper, thus providing an advantage that the manufacturing cost can be relatively low. However, since the use of the NPN-type transistor 113 designed for a large electric current entails a large power loss between the collector and emitter thereof, the power supply efficiency is somewhat low. Also, a voltage higher than the output voltage $V_p$ of the power supply by 7 is not available.

Figure 9:
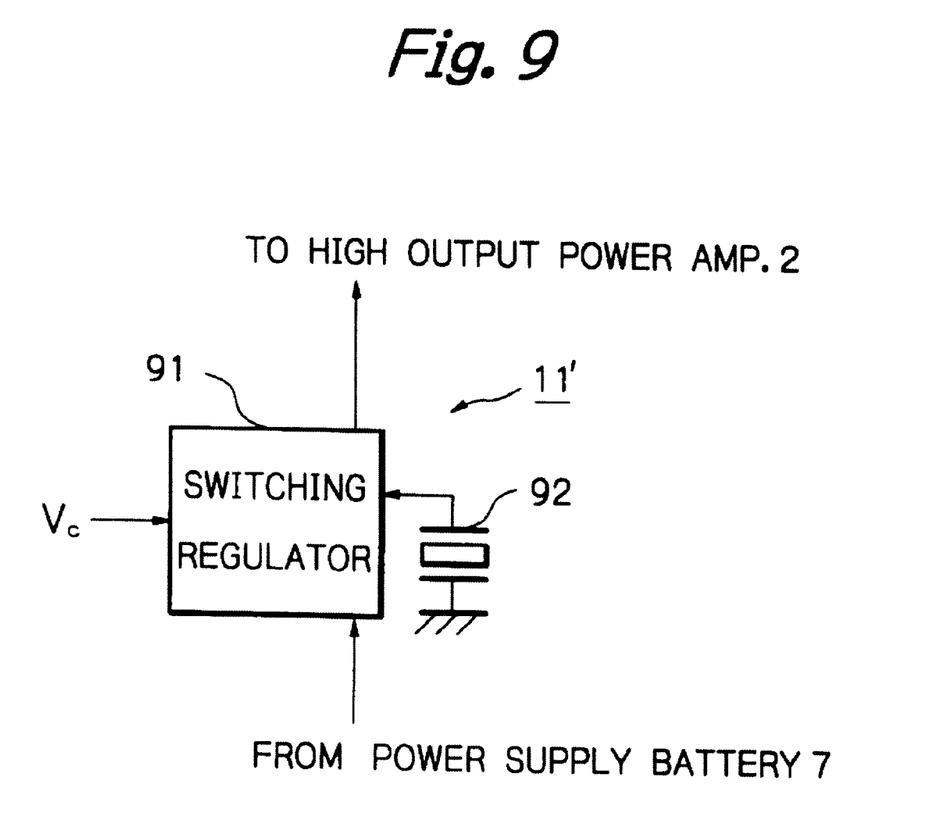
FIG. 9 is a circuit diagram of a modification of the voltage converter of FIGS. 6 and 8.

In FIG. 9, which is a circuit diagram of a modification of the voltage converter 11 of FIGS. 6 and 8, the voltage converter 11' is constructed by a switching regulator 91 and an oscillator 92 for supplying a clock signal to the switching regulator 91, thus improving the power supply efficiency and the overall efficiency. Also, the supply voltage $V_p'$ of the high power amplifier 2 can be raised above the output voltage $V_p$ of the power supply battery 7.

As explained hereinabove, according to the present invention, in order not to prevent the phase error of a transmission burst from being generated, the voltage converter is provided to raise the power supply voltage only for a short time period before and after a steady-state burst including rising and falling ramping time periods. Therefore, the saturation point of the high power amplifier can be controlled so that rapid fluctuations of amplitude envelopes within the high power amplifier occurring near the rising and falling ramping time periods do not intersect the phase fluctuation zone.

As a result, any possible degradation of signal reception due to the phase fluctuations (phase error) of the high power amplifier can be suppressed and the average phase error or the maximum phase error of the transmission burst can be confined with an allowable range.

Also, a fixed gain driver amplifier and a digital baseband level converter are provided in place of a variable power driver amplifier. As a result, the optimization of input level of the saturation type high power amplifier can be realized in a digital fashion instead of an analog fashion so that the transmission power control apparatus can be integrated in a simple fashion to control the transmission power on a highly reproducible basis at low cost.

Further, when the supply voltage of the saturation type high power amplifier is set to the lower limit value in order to ensure the desired transmission output power level in the steady-state burst period, the high power amplifier can be operated highly efficiently in the steady-state burst period which constitutes almost all the transmission burst period, so that any unnecessary increase in the average power consumption by the radio transmitter including the transmission output power control apparatus according to the invention can be prevented.

Additionally, since the voltage converter is formed by a series dropper, the voltage converter can be prepared in a simple manner at low cost. Still further, since the voltage converter is formed by a switching regulator, the supply voltage can be raised above the output voltage of the power supply battery of the radio transmitter.

What is claimed is:

1. A burst-type transmission output power control apparatus, comprising:

a variable power driver for amplifying a modulated wave signal;

a saturation type high power amplifier, connected to said variable power driver, for amplifying an output signal of said variable power driver;

a directional coupler, connected to said saturation type high power amplifier, for taking out a part of an output signal of said high power amplifier;

a variable attenuator, connected to said directional coupler, for receiving the part of the output signal of said high power amplifier;

a detector connected to said variable attenuator, a degree of attenuation of said variable attenuator being regulated to cause an input level of said detector to be constant;

a relative error amplifier, connected to said detector, for comparing an output signal of said detector with a reference voltage having a steady-state burst waveform including rising and falling ramping waveforms before and after said steady-state waveforms to generate an error voltage and transmit said error voltage to an input of said saturation type high power amplifier, thus controlling the output signal of said saturation type high power amplifier so that the output signal of said detector is brought close to said reference voltage; and a voltage converter, connected to said saturation type high power amplifier, for supplying a power supply voltage to said saturation type high power amplifier so that a saturation output of said saturation type high power amplifier is raised only for a short period before and after said steady-state burst waveform including said rising and falling time periods, said variable power driver being controlled to cause a control sensitivity of said saturation type high power amplifier to be constant relative to a transmission level.

2. The apparatus as set forth in claim 1, further comprising a transmission converter for modulating two digital baseband signals to generate said modulated signal.

3. The apparatus as set forth in claim 1, wherein said power supply voltage supplied by said voltage converter to said saturaturation type high power amplifier during a period of said steady-state burst waveform is a lower limit value, thus ensuring a desired transmission power level of said saturation type high power amplifier.

4. The apparatus as set forth in claim 1, wherein said voltage converter comprises a series dropper.

5. The apparatus as set forth in claim 1, wherein said voltage converter comprises a switching regulator.

6. A burst-type transmission output power control apparatus, comprising:

a digital base band level converter for regulating digital baseband signals;

a transmission converter, connected to said digital base band level converter, for modulating said two regulated digital baseband signals to generate a modulated wave signal;

a fixed power driver, connected to said transmission converter for amplifying said modulated wave signal;

a saturation type high power amplifier, connected to said fixed power driver, for amplifying an output signal of said fixed power driver;

a directional coupler, connected to said saturation type high power amplifier, for taking out a part of an output signal of said high power amplifier;

a variable attenuator, connected to said directional coupler, for receiving the part of the output signal of said high power amplifier;

a detector connected to said variable attenuator, a degree of attenuation of said variable attenuator being regulated to cause an input level of said detector to be constant;

a relative error amplifier, connected to said detector, for comparing an output signal of said detector with a reference voltage having a steady-state burst waveform including rising and falling ramping waveforms before and after said steady-state waveforms to generate an error voltage and transmit said error voltage to an input of said saturation type high power amplifier, thus controlling the output signal of said saturation type high power amplifier so that the output signal of said detector is brought close to said reference voltage; and a voltage converter, connected to said saturation type high power amplifier, for supplying a power supply voltage to said saturation type high power amplifier so that a saturation output of said saturation type high power amplifier is raised only for a short period before and after said steady-state burst waveform including said rising and falling time periods, said digital base band level converter being controlled to cause a control sensitivity of said saturation type high power amplifier to be constant relative to a transmission level.

7. The apparatus as set forth in claim 6, wherein said power supply voltage supplied by said voltage converter to said saturation type high power amplifier during a period of said steady-state burst waveform is a lower limit value, thus ensuring a desired transmission power level of said saturation type high power amplifier.

8. The apparatus as set forth in claim 6, wherein said voltage converter comprises a series dropper.

9. The apparatus as set forth in claim 6, wherein said voltage converter comprises a switching regulator.

* * * * *